(12) United States Patent
Liu

(10) Patent No.: US 10,782,337 B2
(45) Date of Patent: Sep. 22, 2020

(54) SYNCHRONIZED NOISE MEASUREMENT SYSTEM

(71) Applicant: ProPlus Design Solutions, Inc., San Jose, CA (US)

(72) Inventor: Zhihong Liu, Cupertino, CA (US)

(73) Assignee: Jinan ProPlus Electronics Co., Ltd., Jinan, Shandong Province (CN)

( * ) Notice: Subject to any disclaimer, the term of this patent is extended or adjusted under 35 U.S.C. 154(b) by 863 days.

(21) Appl. No.: 15/388,903

(22) Filed: Dec. 22, 2016

(65) Prior Publication Data

US 2018/0180662 A1    Jun. 28, 2018

(51) Int. Cl.
  *G01R 31/26*  (2020.01)
  *G01R 31/28*  (2006.01)
  *G01R 29/26*  (2006.01)

(52) U.S. Cl.
  CPC ..... *G01R 31/2646* (2013.01); *G01R 31/2856* (2013.01); *G01R 29/26* (2013.01)

(58) Field of Classification Search
  CPC . G01R 29/26; G01R 31/2646; G01R 31/2856
  See application file for complete search history.

(56) References Cited

U.S. PATENT DOCUMENTS

| | | | |
|---|---|---|---|
| 4,661,767 A * | 4/1987 | Sharrit | G01R 23/16 324/615 |
| 9,459,301 B2 * | 10/2016 | Liu | H03F 1/0277 |
| 9,500,697 B2 * | 11/2016 | Liu | G01R 31/2646 |
| 2004/0059972 A1 * | 3/2004 | Khoche | G01R 31/31707 714/724 |
| 2004/0091033 A1 * | 5/2004 | Chen | H01Q 3/22 375/226 |
| 2005/0137814 A1 * | 6/2005 | Kelly | G01R 29/26 702/69 |
| 2011/0181298 A1 * | 7/2011 | Kuramochi | G01R 13/0272 324/613 |
| 2015/0212131 A1 * | 7/2015 | Liu | H03F 1/0277 324/613 |
| 2015/0212145 A1 * | 7/2015 | Liu | G01R 31/2646 324/613 |
| 2017/0248650 A1 * | 8/2017 | Qin | G01R 31/2646 |
| 2018/0109330 A1 * | 4/2018 | Chang | H04B 1/1027 |

* cited by examiner

*Primary Examiner* — Manuel A Rivera Vargas
*Assistant Examiner* — Yaritza H Perez Bermudez
(74) *Attorney, Agent, or Firm* — Thomas C. Chan; Silicon Valley Patent Group LLP

(57) ABSTRACT

Embodiments of apparatuses of a synchronized noise measurement system and methods for using the same are disclosed. In one embodiment, a method of performing noise measurement includes setting up a plurality of device under tests (DUTs), performing noise measurement of the plurality of DUTs synchronously using programmable testing parameters to generate a noise measurement data, collecting the noise measurement data from the plurality of DUTs in parallel, and analyzing the noise measurement data collected to identify deviations in noise performance caused by manufacturing process variations or environmental variations for the plurality of DUTs.

21 Claims, 10 Drawing Sheets

SYNCHRONIZED NOISE MEASUREMENT SYSTEM

FIELD

The present disclosure relates to the field of semiconductor design for yield equipment. In particular, the present disclosure relates to apparatuses of a synchronized noise measurement system and methods for using the same.

BACKGROUND

Flicker noise, also known as 1/f noise, is an important characteristic for various semiconductor devices, such as MOSFETs, BJTs, JFETs, Diode, and integrated circuit (IC) resistors. Not only does it directly impact the circuit performance of modern ICs, but it also has been used as an important technique to characterize the manufacturing process quality. On-wafer noise measurement has been done more often in massive volume by semiconductor foundries. SPICE models are built, even with statistical corners, to be distributed to circuit designers to assist them to accurately analyze the impact of noise to circuit performance, especially to radio frequency, low noise, and high-sensitive devices. Accurately measuring noise at wafer level is challenging and time consuming, mostly due to the noisy probing environment, accurate DC bias requirement, and complicated cable connections. Comparing noise measurements of two different devices can be even more challenging.

In conventional noise measurement systems, one approach is to compare one noise measurement data to another measurement data collected from the same test equipment. One drawback of this approach is that the noise measurement process is very time consuming as the two sets of noise measurement data have been collected sequentially, which may take hours or days to perform. Another drawback of this approach is that when discrepancies are found, it would be difficult to determine whether the discrepancies are due to variations of the manufacturing process, variations of the test setup, or variations of the test environment.

Therefore, it is desirable to address the issues of conventional noise measurement systems.

SUMMARY

In designing and manufacturing integrated circuits, due to effects of manufacturing process variations and effects caused by variations of the test environment, even a same design being manufactured on a same wafer or on different wafers can produce different noise measurements. Such different noise measurements can adversely impact the yield of the integrated circuit because it would be difficult to determine how much design margin one can assume. The disclosed apparatuses and methods identify deviations and/or irregularities in noise measurement data that may be caused by manufacturing process variations, and common mode interferences. The disclosed apparatuses and methods further identify correlations of testing parameters and at the same time improve the performance of the noise measurement process to enable more efficient design and manufacturing of integrated circuits.

Apparatuses of a synchronized noise measurement system and methods for using the same are disclosed. In one embodiment, a noise measurement system includes a controller configured to set up a plurality of device under tests (DUTs); a plurality of noise measurement channels, controlled by the controller, configured to perform noise measurement of the plurality of DUTs synchronously using programmable testing parameters to generate a noise measurement data, and collect the noise measurement data from the plurality of DUTs in parallel; and an analyzer, controlled by the controller, configured to analyze the noise measurement data collected to identify deviations in noise performance caused by manufacturing process variations or environmental variations for the plurality of DUTs.

In another embodiment, a method of performing noise measurement includes setting up a plurality of device under tests (DUTs), performing noise measurement of the plurality of DUTs synchronously using programmable testing parameters to generate a noise measurement data, collecting the noise measurement data from the plurality of DUTs in parallel, and analyzing the noise measurement data collected to identify deviations in noise performance caused by manufacturing process variations or environmental variations for the plurality of DUTs.

BRIEF DESCRIPTION OF THE DRAWINGS

The aforementioned features and advantages of the disclosure, as well as additional features and advantages thereof, will be more clearly understandable after reading detailed descriptions of embodiments of the disclosure in conjunction with the non-limiting and non-exhaustive aspects of following drawings. Like numbers are used throughout the figures.

DESCRIPTION OF EMBODIMENTS

Embodiments of apparatuses of a synchronized noise measurement system and methods for using the same are disclosed. The following descriptions are presented to enable any person skilled in the art to make and use the disclosure. Descriptions of specific embodiments and applications are provided only as examples. Various modifications and combinations of the examples described herein will be readily apparent to those skilled in the art, and the general principles defined herein may be applied to other examples and applications without departing from the scope of the disclosure. Thus, the present disclosure is not intended to be limited to the examples described and shown, but is to be accorded the widest scope consistent with the principles and features disclosed herein. The word "exemplary" or "example" is used herein to mean "serving as an example, instance, or illustration." Any aspect or embodiment described herein as "exemplary" or as an "example" in not necessarily to be construed as preferred or advantageous over other aspects or embodiments.

Figure 1:
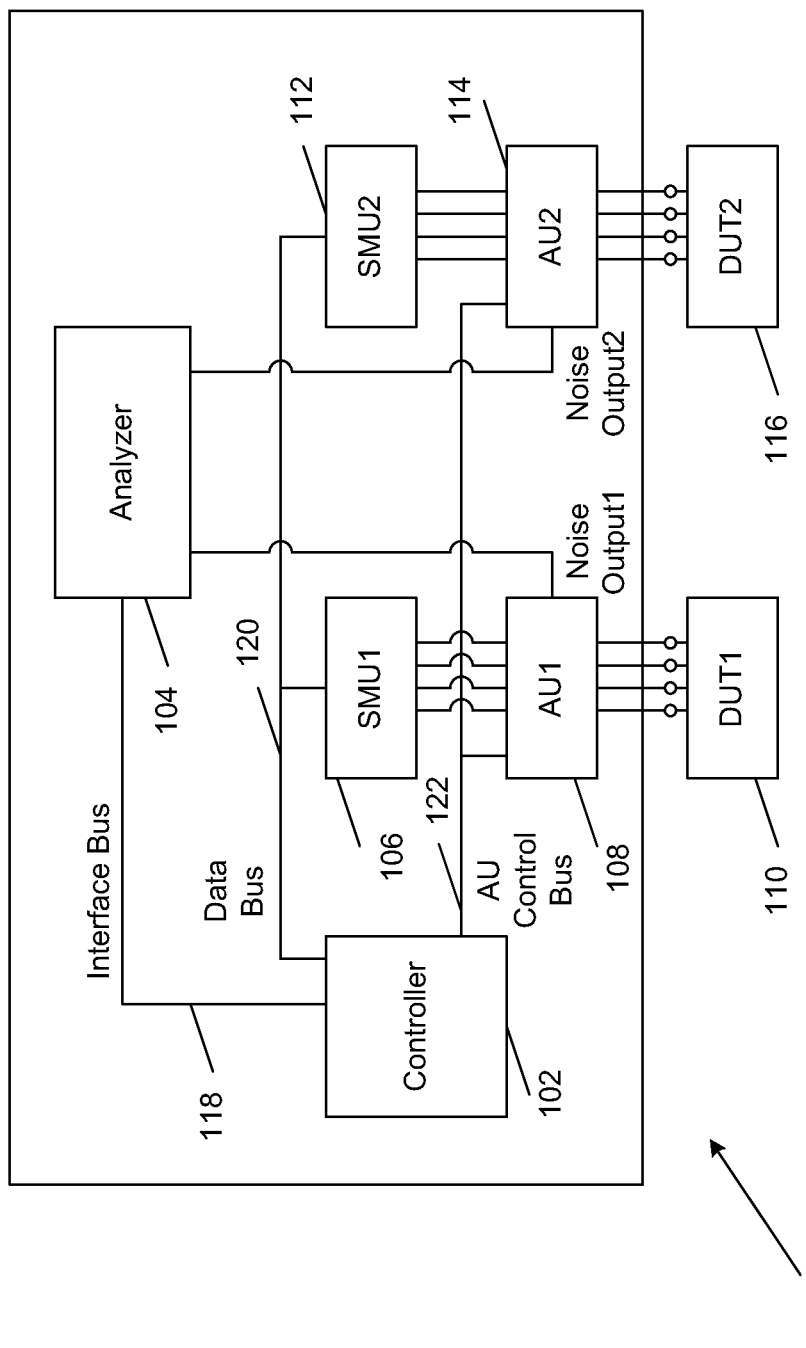
FIG. 1 illustrates an exemplary noise measurement system according to aspects of the present disclosure.

FIG. 1 illustrates an exemplary noise measurement system according to aspects of the present disclosure. In the example shown in FIG. 1, the noise measurement system 100 includes controller 102, analyzer 104 and two noise measurement channels. The first noise measurement channel includes source measurement unit 1 (SMU1) 106, amplifier unit 1 (AU 1) 108, which are controlled by controller 102 to perform noise measurements on device under test 1 (DUT 1) 110. The second noise measurement channel includes source measurement unit 2 (SMU2) 112, amplifier unit 2 (AU 2) 114, which are controlled by controller 102 to perform noise measurements on device under test 2 (DUT 2) 116. The controller 102 communicates with and controls the analyzer 104 via an interface bus 118; communicates with and controls SMU1 and SMU2 via a data bus 120; and communicates with and controls AU1 and AU2 via AU control bus 122. The noise output 1 from DUT 1 is communicated to the Analyzer 104 via AU1; and the noise output 2 from DUT 2 is communicated to the Analyzer 104 via AU2. Examples of detail implementations and operations of a noise measurement channel is further described below in association with FIG. 3, FIG. 4A and FIG. 4B. The controller 102, analyzer 104 and the noise measurement channels can be configured to perform the methods described in FIG. 5, and FIG. 7 through FIG. 10.

In some embodiments, the controller 102 can be configured to set up each channel of the noise measurement system 100 in substantially the same manner operations of both channel 1 and channel 2 can be synchronized. For example, the noise measurement operations in both channel 1 and channel 2 can be synchronized to start at the same time within a predetermined margin of deviation/error. In addition, the control of SMU1 106 and SMU2 112 as well as the control of AU1 108 and AU2 114 by the controller 102 can be synchronized. In this configuration, the noise measurement channels may be setup in parallel and triggered in a synchronized manner.

According to aspects of the present disclosure, the noise measurement system 100 employs a common data acquisition approach, which can be synchronized in data recordation and acquisition to ensure data from the different channels are collected at the same time within a programmable margin of error tolerance. The synchronized approach of data recordation and acquisition can enable efficient data analysis and identification of device local variations caused by manufacturing process variations, common mode interferences caused by variations of testing environment, and correlations of testing parameters as described below in association with FIG. 5, FIG. 6A and FIG. 6B.

Figure 2:
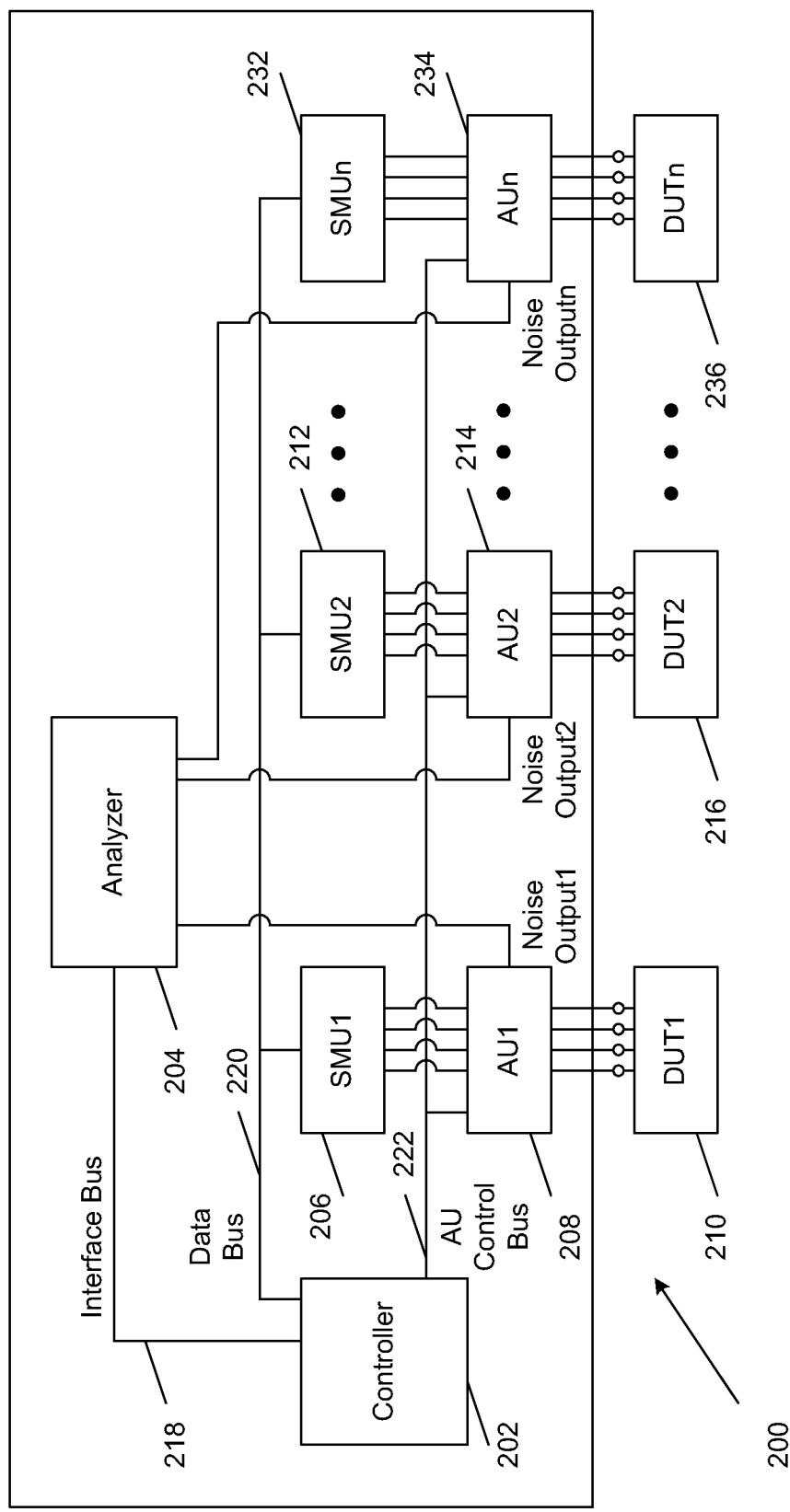
FIG. 2 illustrates another exemplary noise measurement system according to aspects of the present disclosure.

FIG. 2 illustrates another exemplary noise measurement system according to aspects of the present disclosure. As shown in FIG. 2, the noise measurement system 200 expands the noise measurement system 100 of FIG. 1 to include additional noise measurement channels.

The noise measurement system 200 includes controller 202, analyzer 204 and multiple noise measurement channels. The first noise measurement channel includes source measurement unit 1 (SMU1) 206, amplifier unit 1 (AU 1) 208, which are controlled by controller 202 to perform noise measurements on device under test 1 (DUT 1) 210. The second noise measurement channel includes source measurement unit 2 (SMU2) 212, amplifier unit 2 (AU 2) 214, which are controlled by controller 202 to perform noise measurements on device under test 2 (DUT 2) 216. The $n^{th}$ noise measurement channel includes source measurement unit n (SMUn) 232, amplifier unit n (AUn) 234, which are controlled by controller 202 to perform noise measurements on device under test n (DUTn) 236. Note that number of noise measurement channels, represented by n, may be based on particular noise measurement test design and performance requirements. In general, the number of noise measurement channels may be programmable.

The controller 202 communicates with and controls the analyzer 204 via an interface bus 218; communicates with and controls SMU1 206 through SMUn 232 via a data bus 220; and communicates with and controls AU1 208 through AUn 234 via AU control bus 222. The noise output 1 from DUT 1 210 is communicated to the Analyzer 204 via AU1 208; the noise output 2 from DUT 2 216 is communicated to the Analyzer 104 via AU2 214; and the noise output n from DUT n 236 is communicated to the Analyzer 104 via AUn 234. Examples of detail implementations and operations of a noise measurement channel is further described below in association with FIG. 3, FIG. 4A and FIG. 4B. The controller 202, analyzer 204 and the noise measurement channels can be configured to perform the methods described in FIG. 5, and FIG. 7 through FIG. 10.

According to aspects of the present disclosure, the controller 202 can be configured to set up each channel of the noise measurement system 200 in substantially the same manner operations of channel 1 through channel n can be synchronized. For example, the noise measurement operations in channel 1 through channel n can be synchronized to start at the same time, within a predetermined margin of error tolerance. In addition, the control of SMU1 206 through SMUn 232 as well as the control of AU1 208 through AUn 234 by the controller 202 can be synchronized. In this configuration, the noise measurement channels may be setup in parallel and triggered in a synchronized manner.

According to aspects of the present disclosure, the noise measurement tests of each channel may be conducted under substantially the same measurement conditions, such as the same temperature and lighting. In addition, each DUT may be set up with substantially the same bias conditions, load and input resistors, filter time constants, etc. Upon setting up the multiple measurement channels, the controller 202 may then check the stability of the setup to determine whether the noise measurement process is ready to start. Then the controller 202 may then start the noise measurement operations in a synchronized manner.

Figure 3:
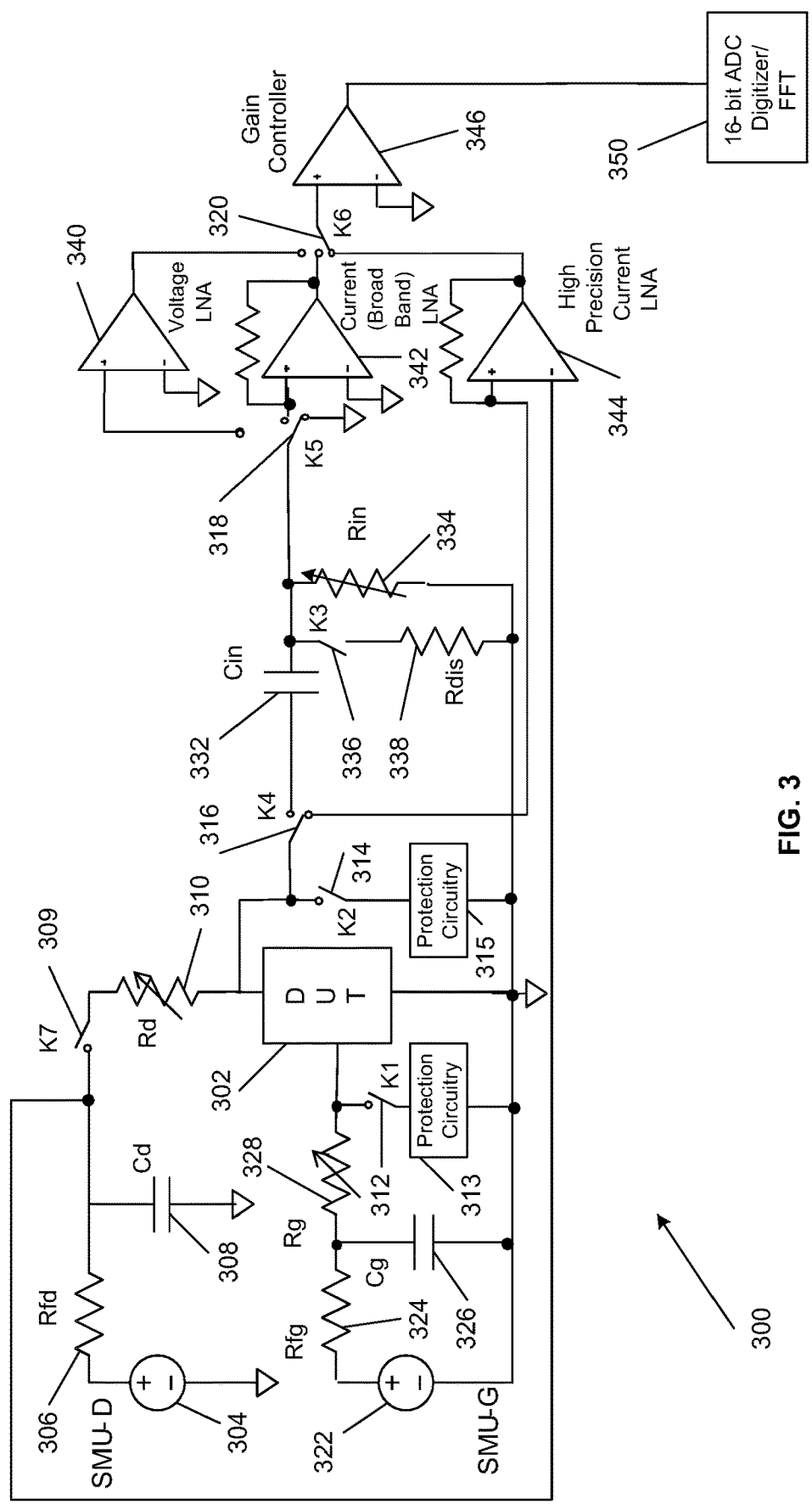
FIG. 3 illustrates an exemplary implementation of one channel of a noise measurement system according to aspects of the present disclosure.

FIG. 3 illustrates an exemplary implementation of one channel of a noise measurement system according to aspects of the present disclosure. In the exemplary implementation shown in FIG. 3, noise measurements of a device under test (DUT) 302 can be performed by the noise measurement apparatus 300. A first circuit path of the noise measurement apparatus 300 may include a first source measurement unit 304 (SMU-D), resister 306 (Rfd), capacitor 308 (Cd), programmable switch 309 (K7), and variable resister 310 (Rd) coupled to a first terminal of the DUT 302. A second circuit path of the noise measurement apparatus 300 may include a third source measurement unit 322, resister 324 (Rfg) and capacitor 326 (Cg), as well as variable resistor 328 (Rg) coupled to a second terminal of the DUT 302. A decoupling circuit of the noise measurement apparatus 300 may include capacitor 332 (Cin), variable resistor 334 (Rin), as well as programmable switch 336 (K3) and resistor 338 (Rdis) in parallel with variable resistor 334 (Rin), which are configured to decouple the DUT 302 and the amplification circuit of the noise measurement apparatus 300. In the particular embodiment shown in FIG. 3, the amplification circuit may include a voltage LNA 340, a broadband current LNA 342, a high precision current LNA 344, and a gain controller 346. The noise measurement apparatus 300 may further include ADC digitizer or FFT 350.

According to embodiments of the present disclosure, charge built-up (Vd) at the output terminal (also referred to as the first terminal) of the DUT 302 may be discharged through the control of programmable switch 314 (K2), protection circuitry 315, and programmable switch 316 (K4). For example, when K2 is closed and K4 is open, the charge at the output terminal may be discharged to the circuit ground through K2 and protection circuitry 315. In some implementations, it is desirable to discharge the output terminal of the DUT 302 before discharging the second terminal of the DUT 302 via the programmable switch 312 (K1) and protection circuitry 313. Similar to the description in FIG. 2, for discharging capacitor 332 (Cin), charges may be discharged through resistor 334 (Rin). To shorten the discharging time, charges in capacitor 332 (Cin) may be discharged through resistor 338 (Rdis) with programmable switch 336 (K3) being closed.

Programmable switch 318 (K5) and programmable switch 320 (K6) may be configured to enable the noise measurement apparatus 300 to adjust input impedance of the amplification circuit based on the output signal characteristics of the DUT 302. In a particular embodiment, the noise measurement apparatus 300 may be configured to select a first amplifier in a plurality of amplifiers of the amplification circuit (for example select voltage LNA 340) to be used to measure the noise based on the output signal characteristics of the DUT 302. In addition, the noise measurement apparatus 300 may be configured to detect changes in the output signal characteristics of the DUT 302, select a second amplifier (for example select high precision current LNA 344) in the plurality of amplifiers to measure the noise based on the changes in the output signal characteristics of the DUT 302, and transition from the first amplifier (e.g. voltage LNA 340) to the second amplifier (e.g. high precision current LNA 344) to measure the noise of the DUT 302.

In a particular embodiment of the noise measurement apparatus 300, the decoupling circuit may be bypassed by controlling programmable switch 316 to direct output signals of the DUT 302 to an input of the amplification circuit, for example to a first input of the high precision current LNA 344, directly. A second input of the current LNA 344 may be received from the first circuit path by controlling programmable switch 309 (K7).

According to aspects of the present disclosure, a noise measurement apparatus may include a low-noise pre-amplifier to amplify the device under test (DUT) noise signal, a dynamic signal analyzer to capture the noise time-domain data and convert them into frequency domain noise data through FFT, and a DC bias system to provide proper biases to DUT. In one approach, battery may be used to bias DUT as it can be sufficiently noise free. However, battery may be difficult to maintain and adapt to the required bias conditions. In an alternative approach, a programmable DC bias supply may be used. In this alternative approach, programmable source measurement units (SMUs) may be employed to bias and measure the current of DUT. Since the SMUs may not be 'quiet' enough for noise measurement, filters may be employed to clean up the residual noises from the DC bias.

Figure 4A:
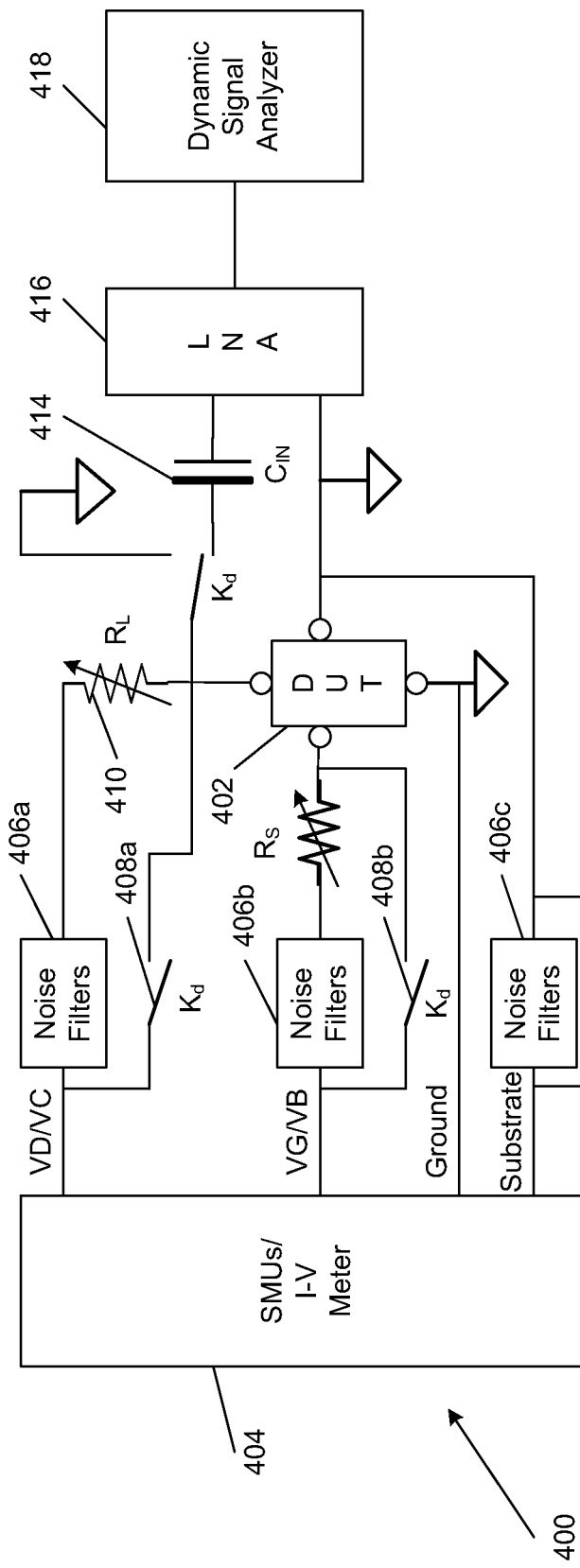
FIG. 4A illustrates another exemplary implementation of one channel of a noise measurement system according to aspects of the present disclosure.

FIG. 4A illustrates another exemplary implementation of one channel of a noise measurement system according to aspects of the present disclosure. In this example, it shows a diagram of a noise measurement apparatus 400 for MOSFETs or BJT devices, such as DUT 402. The noise measurement apparatus 400 may include one or more SMUs 404 (or I-V meter) to drive each of the first, second, third, and fourth circuit paths, where each of the circuit paths is coupled to a terminal of the DUT 402. Each of the circuit paths may include one or more noise filters (406a, 406b, and 406c), except the third circuit path, which is the circuit ground. The one or more noise filters may be bypassed by programmable switches (408a, 408b, and 408c), respectively.

In addition to the components listed above, the noise measurement apparatus 400 may include a load variable resistor 410 ($R_L$), an input variable resistor 412 ($R_S$) and a decoupling capacitor 414 ($C_{in}$), which decouples the DUT 402 from low noise amplifier(s) 416. The output of the LNA 416 may be analyzed by a dynamic signal analyzer 418. Programmable switches 408a, 408b, and 408c (Kd) are used to switch between noise and DC measurements. Such a system can be controlled so that the selection of measurement modes, resistors, biases, and filter time constants can be programmable.

Figure 4B:
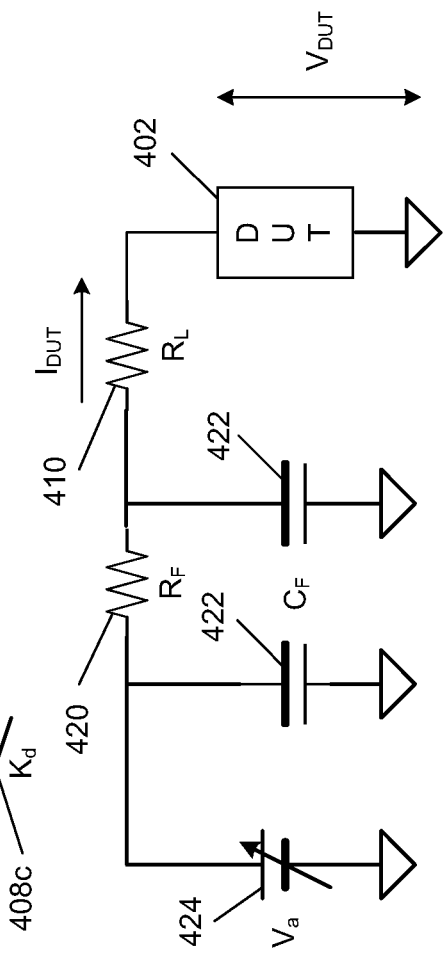
FIG. 4B illustrates an exemplary drain direct current biasing circuit of FIG. 4A according to aspects of the present disclosure.

FIG. 4B illustrates an exemplary drain direct current biasing circuit of FIG. 4A according to aspects of the present disclosure. As shown in FIG. 4B, a diagram that shows the simplified drain DC biasing circuit of FIG. 4A. The bias filter includes resistor 420 ($R_F$) and capacitors 422 ($C_F$). If the leakage current of the filter capacitor is negligible, the DUT bias voltage $V_{dut}$ can be written as $$V_{dut} = V_a - I_{dut}(R_F + R_L), \quad (1)$$

where $R_L$ is the loading resistor, $V_a$ (424) is the output voltage of SMU, and $R_F$ is the filter resistor. To achieve accurate $V_{dut}$, both $I_{dut}$ and $R_F + R_L (=R)$ are desirable be accurate as well. The stabilization of the current $I_{dut}$ may depend on the RC time constant of the filters, while the error of resistance may largely depend on the quality of the resistor and the environment conditions. The total error of $V_{dut}$ can be written as $$\frac{\Delta V_{dut}}{V_{dut}} = -\frac{R I_{dut}}{V_{dut}}\left(\frac{\Delta I_{dut}}{I_{dut}} + \frac{\Delta R}{R}\right), \text{ where, } R = R_L + R_F. \quad (2)$$

The error in $I_{dut}$ may be difficult to mitigate due to the leakage of the filter capacitor (a few tens of nA) and limited charging time in high volume measurement. As a result, a larger value of R (larger $R_L$) can lead to a larger error of $V_{dut}$. A smaller $R_L$ may be chosen to ensure accurate $V_{dut}$. Besides, a shorter filter time constant may be selected as long as the filter low end cut off frequency can be met. To reduce the error induced by the leakage of $C_F$, high quality capacitors may be used.

The filters, $R_L$ and coupling capacitor also determine the time for the system to stable after applying required bias. For efficient measurement, smaller R, smaller $C_F$ and $C_{in}$ may be desired. However, C and R cannot be too small as they may also affect the measurement quality to be discussed in the following sections. The typical time for the system to stabilize after being applied the bias can be between 10 to 100 seconds, mostly depending on the bias condition and measurement accuracy. The overall system stabilization time can be determined by the longest charging time of all the filtered SMU channels. It may take 3-5 τ's (τ=R×C) of the bias system before a reliable noise data can be measured.

According to aspects of the present disclosure, the low noise amplifier in a noise measurement system can be a factor in getting quality data. Both voltage amplifier and current amplifier (a.k.a., trans-conductance amplifier) may be used for low noise measurement. The selection of the amplifiers may depend on the signal nature, and primarily depend on the output impedance of the device under test (DUT). A voltage amplifier can be a better choice for measuring DTU with low output impedance, while a current amplifier can be more suitable for measuring high impedance signals. For example, when measuring MOSFET noise, a current amplifier can be used in sub-threshold and saturation regions where the Rout (1/Gds) may be high, a voltage amplifier can then be chosen for linear (triode) region. Another advantage of using a current amplifier may be its insensitivity to prober noise when doing wafer level measurement due to its low input impedance. Note that the voltage amplifier also has a lower cutoff frequency than the current amplifier when a large $R_L$ is used to measure low level noise. On the other hand, a current amplifier may not work well for low impedance DUT due to its reduced bandwidth and sensitivity. Current amplifiers may also have higher noise at higher frequency as it approaches to the amplifier bandwidth due to LNA parasitic capacitance. In addition to input impedance and bandwidth, LNA noise floor can also be a key consideration. Generally, a voltage LNA can have a lower voltage noise floor, also called input referred noise voltage floor, while a current LNA should have a lower current noise floor. This because that noise voltage can be more sensitive for low impedance DUTs and noise current can be more sensitive for high impedance DUTs.

Figure 5:
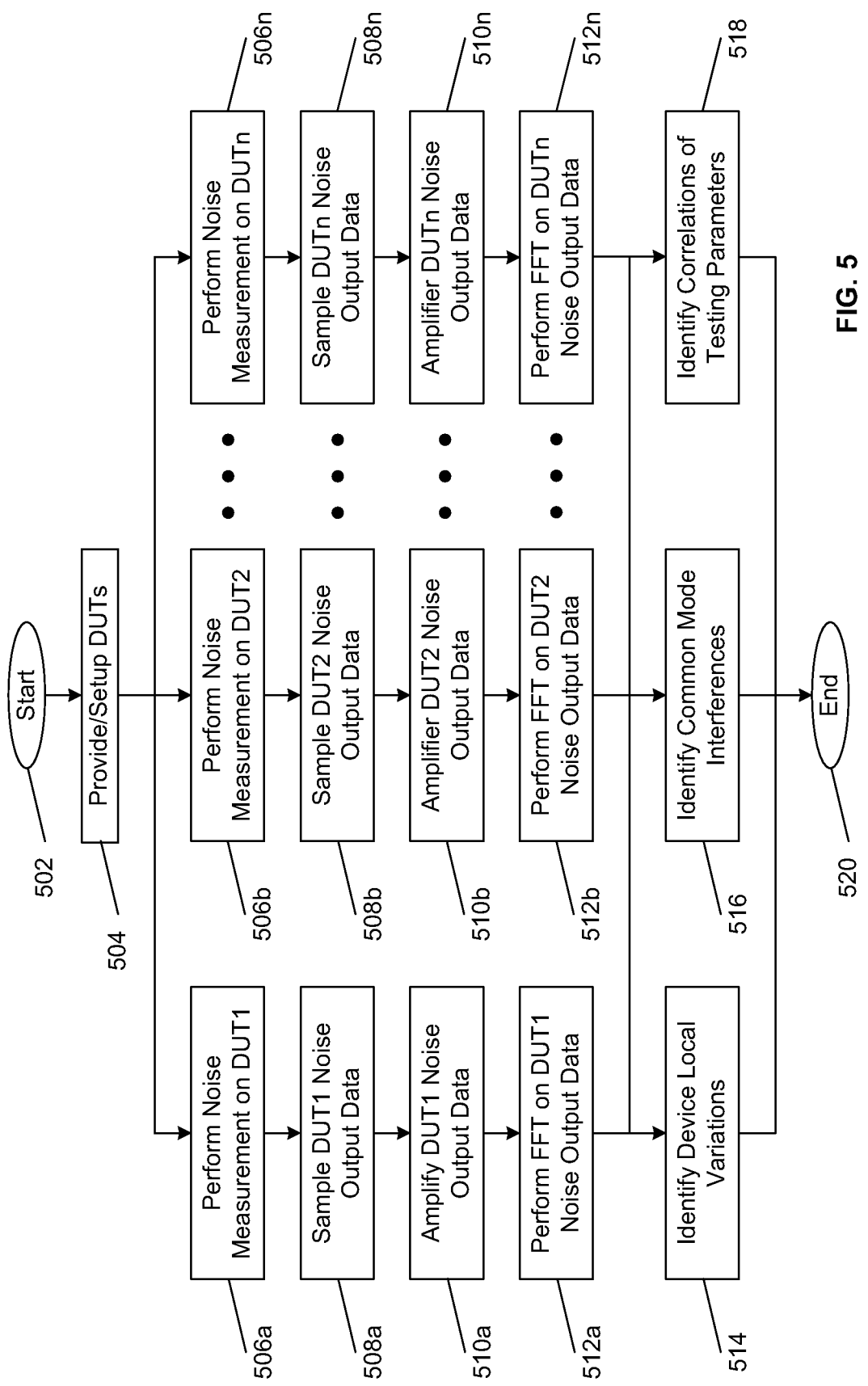
FIG. 5 illustrates an exemplary flowchart depicting operations of a synchronized noise measurement system according to aspects of the present disclosure.

FIG. 5 illustrates an exemplary flowchart depicting operations of a synchronized noise measurement system according to aspects of the present disclosure. In the exemplary implementation shown in FIG. 5, the flowchart starts in block 502. In block 504, the DUTs of the noise measurement system are being provided and being setup. The setup of the DUTs is described above in association with FIG. 1 and FIG. 2. Upon setting up the DUTs, noise measurement tests in the multiple channels of the noise measurement system may be conducted in parallel synchronously.

In blocks 506a, 506b, through 506n, the noise measurement system performs noise measurements on DUT1, DUT2, through DUTn in parallel, respectively. In blocks 508a, 508b, through 508n, the noise measurement system samples noise output data from DUT1, DUT2, through DUTn in parallel, respectively. In blocks 510a, 510b, through 510n, the noise measurement system amplifies noise output data from DUT1, DUT2, through DUTn in parallel, respectively. In blocks 512a, 512b, through 512n, the noise measurement system performs Fast Fourier Transformation (FFT) on the noise output data from DUT1, DUT2, through DUTn in parallel, respectively.

The transformed noise measurement data collected from each channel may then be analyzed to identify device local variations, common mode interferences, and correlations of testing parameters. In block 514, the noise measurement system may analyze the transformed noise measurement data collected from each channel to identify device local variations. Since the noise measurements in the multiple channels are performed in parallel and in a synchronized manner, the test environment is kept consistent across the multiple DUTs even though the external test environment may change during the noise measurement process, the impact of such change on the noise output data of DUTs can be substantially similar. This approach allows the analysis of the noise output data to focus variations of the DUTs (also referred to as device local variations) due to manufacturing process variations. The identification of device local variations is further described below in association with FIG. 6A and FIG. 6B.

In block 516, the noise measurement system may analyze the transformed noise measurement data collected from each channel to identify common mode interferences on the DUTs. Since the noise measurements in the multiple channels are performed in parallel and in a synchronized manner, the test environment is kept consistent across the multiple DUTs even though the external test environment may change during the noise measurement process, the impact of such change on the noise output data of DUTs can be substantially similar. In addition, this approach enables the noise output data from different channels to be analyzed together within a certain time period to identify common mode interferences on the noise output data from each channel. Thus, the noise measurement system may be configured to enable a designer to identify and ignore the common mode interferences occurred during the noise measurement process. The identification of common mode interferences is further described below in association with FIG. 6A and FIG. 6B.

In block 518, the noise measurement system may analyze the transformed noise measurement data collected from each channel to identify correlations of testing parameters used for the noise measurements. Since the noise measurements in the multiple channels are performed in parallel and in a synchronized manner, the test environment is kept consistent across the multiple DUTs even though the external test environment may change during the noise measurement process, the impact of such change on the noise output data of DUTs can be substantially similar. In addition, this approach enables the noise measurement system to separately test the impact of testing parameters, such as impacts of length, width, or threshold voltage of DUTs across different copies of the same design in a same wafer or across different wafers. The identification of correlation of testing parameters is further described below in association with FIG. 6A and FIG. 6B. The method ends in block 520.

Figure 6A:
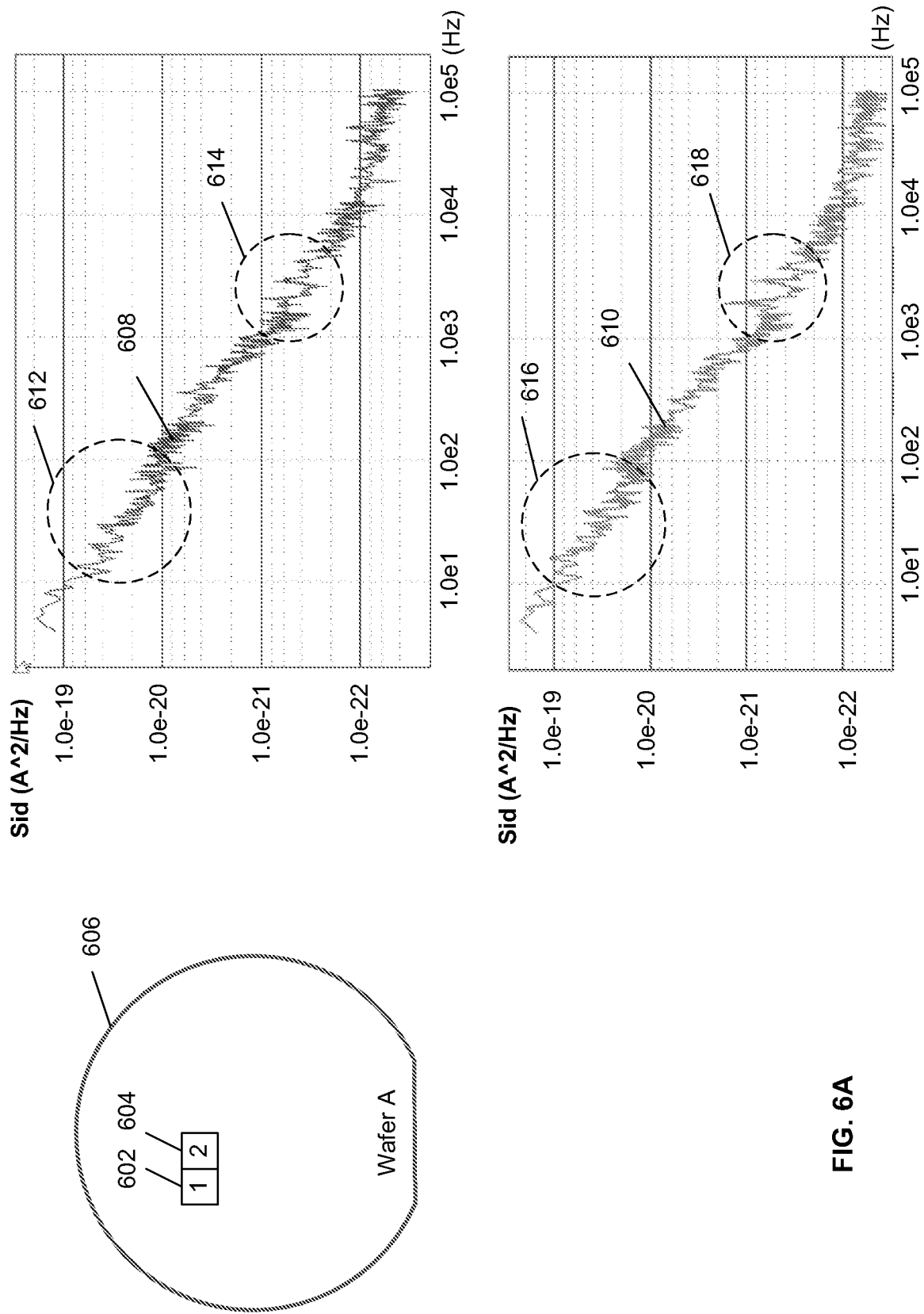
FIG. 6A illustrates a comparison of noise measurement data from two channels of a synchronized noise measurement system according to aspects of the present disclosure.

FIG. 6A illustrates a comparison of noise measurement data from two channels of a synchronized noise measurement system according to aspects of the present disclosure. In the example shown in FIG. 6A, noise measurements from a first DUT 602 (represented by numeral 1) and a second DUT 604 (represented by numeral 2) of wafer A 606 are shown. On the right hand side, the top graph is a plot of noise output data 608 over a frequency spectrum for the first DUT 602. The bottom graph is a plot of noise output data 610 over a frequency spectrum for the second DUT 604.

According to aspects of the present disclosure, the first DUT 602 and the second DUT 604 can be identical circuits in terms of their design. However, as shown from the plots 608 and 610, there are differences in their noise output data measurements. Since noise measurement tests for the first DUT 602 and the second DUT 604 in their corresponding channels of the noise measurement system are conducted in parallel synchronously, the noise measurement system eliminates variations of noise output data in the different channels due to some of the environmental factors. This approach allows the measurements of noise output data of the first DUT 602 and the second DUT 604 to show manufacturing process variations, which is also referred to as device local variations. In this example, dotted circle 612 and dotted circle 616 show a first set of manufacturing process variations of the first DUT 602 and the second DUT 604, respectively. Similarly, dotted circle 614 and dotted circle 618 show a second set of manufacturing process variations for the first DUT 602 and the second DUT 604, respectively. In some implementations, the approach described above may also be applied to DUTs from different wafers.

Figure 6B:
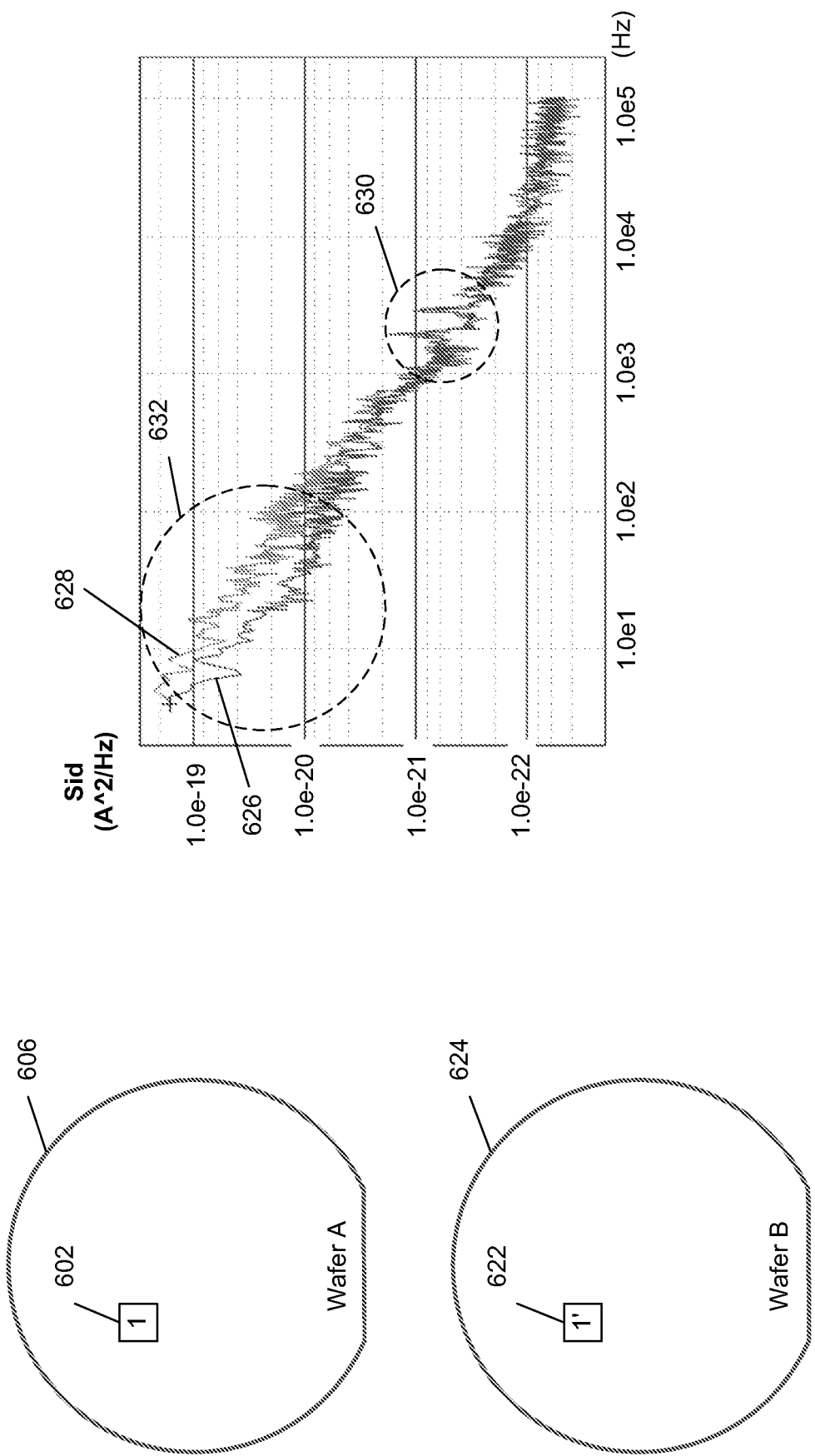
FIG. 6B illustrates another comparison of noise measurement data from two channels of a synchronized noise measurement system according to aspects of the present disclosure.

FIG. 6B illustrates another comparison of noise measurement data from two channels of a synchronized noise measurement system according to aspects of the present disclosure. In the example shown in FIG. 6B, noise measurements from a first DUT 602 (represented by numeral 1) of wafer A 606 and a second DUT 622 (represented by numeral 1') of wafer B 624 are shown. On the right hand side, a plot of noise output data 626 over a frequency spectrum for the first DUT 602, and a plot of noise output data 628 over a frequency spectrum for the second DUT 622 are shown in an overlapped manner.

According to aspects of the present disclosure, the first DUT 602 and the second DUT 622 can be identical circuits in terms of their design. However, as shown from the plots 626 and 628, there are differences in their noise output data measurements. Since noise measurement tests for the first DUT 602 and the second DUT 622 in their corresponding channels of the noise measurement system are conducted in parallel synchronously, the noise measurement system eliminates variations of noise output data in the different channels due to some of the environmental factors. This approach allows the measurements of noise output data of the first DUT 602 and the second DUT 622 to identify common mode interferences. In this example, dotted circle 630 shows a region of irregularities in the measured noise output data for both the first DUT 602 and the second DUT 622 deviate (e.g. two spikes within dotted circle 630), which deviations from an expected trend of the noise output data. Note that dotted circle 632 shows a region of manufacturing process variations of the first DUT 602 and the second DUT 622. In some implementations, the approach described above may also be applied to DUTs from the same wafer.

One of the benefits of the ability to identify common mode interferences is that the deviations in the region shown in dotted circle 630 can be ignored or eliminated in the analyze of the noise performance of the DUTs. This is because such deviations are caused by external factors, for example radiations occurred during the noise measurement process, and they are not inherent to the DUTs. However, with conventional noise measurement systems that are not able to perform the noise measurement tests in parallel in a synchronized manner, for example the noise measurements of the DUTs are performed sequentially, and then the deviations shown in dotted circle 630 may appear in the plot of noise output data of one DUT but not the other. With such conventional noise measurement systems, it would be difficult for a designer to determine whether the deviations in the region identified by dotted circle 630 are caused by manufacturing process variations or caused by other external factors.

In some implementations, the disclosed noise measurement system can be configured to identify correlations of testing parameters of the DUTs. Since noise measurement tests for the DUTs in their corresponding channels of the noise measurement system are conducted in parallel synchronously, the noise measurement system can eliminate variations of noise output data in the different channels due to manufacturing process variations and common mode interferences, and thus enabling designers to focus on correlations of testing parameters. For example, in some embodiments, the DUTs may be controlled to be at different biased conditions. In some other embodiments, the DUTs, such as MOSFETs, may be setup with the same bias condition, but different device dimensions, threshold voltage, etc. In yet some other embodiments, the DUTs, such as MOSFETs, may be setup with the same bias condition and same device dimensions, but in different locations on the same wafer. In yet some other embodiments, the DUTs, such as MOSFETs, may be setup with the same bias condition and same device dimensions, but in the location on different wafers. The disclosed noise measurement system provides a designer with the flexibility to efficiently obtain noise measurement data, and to effectively analyze the noise measurement data to achieve their design objectives.

Figure 7:
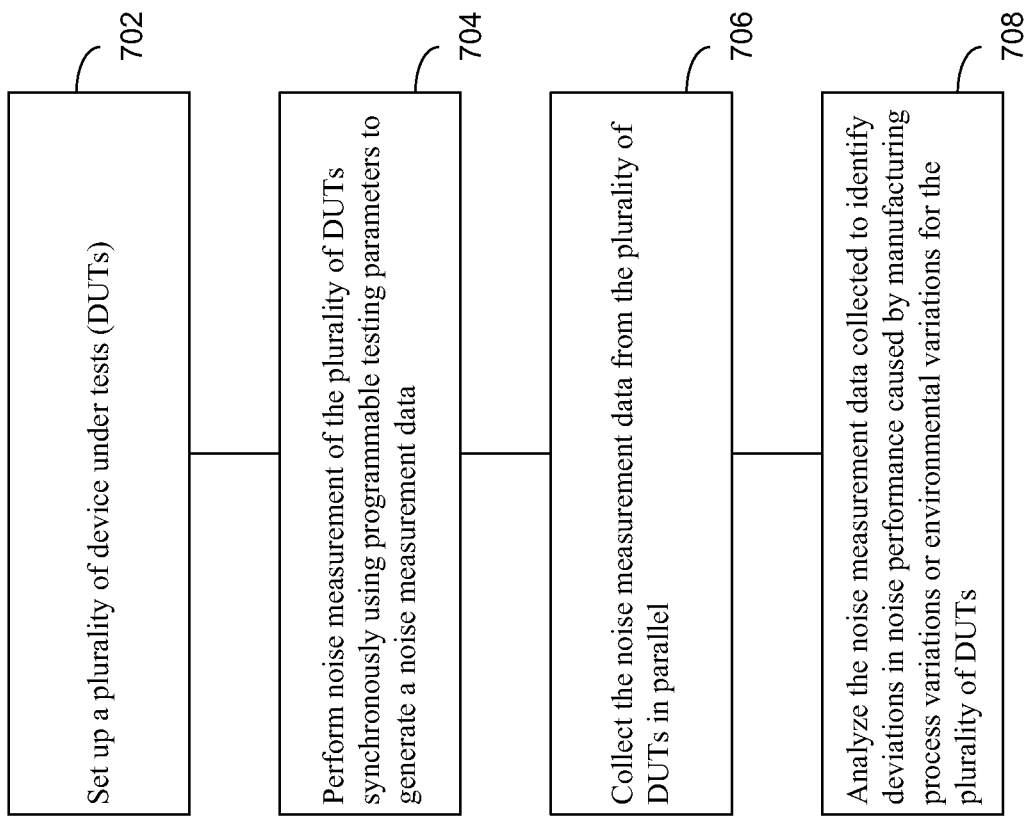
FIG. 7 illustrates a method of performing noise measurement according to aspects of the present disclosure.

FIG. 7 illustrates a method of performing noise measurement according to aspects of the present disclosure. In the example shown in FIG. 7, in block 702, the method sets up or provides a plurality of device under tests DUTs. In block 704, the method performs noise measurement of the plurality of DUTs synchronously using programmable testing parameters to generate a noise measurement data for the plurality of DUTs. In block 706, the method collects the noise measurement data from the plurality of DUTs in parallel. In block 708, the method analyzes the noise measurement data collected to identify deviations in noise performance caused by manufacturing process variations or environmental variations on the plurality of DUTs.

Figures 8, 9:
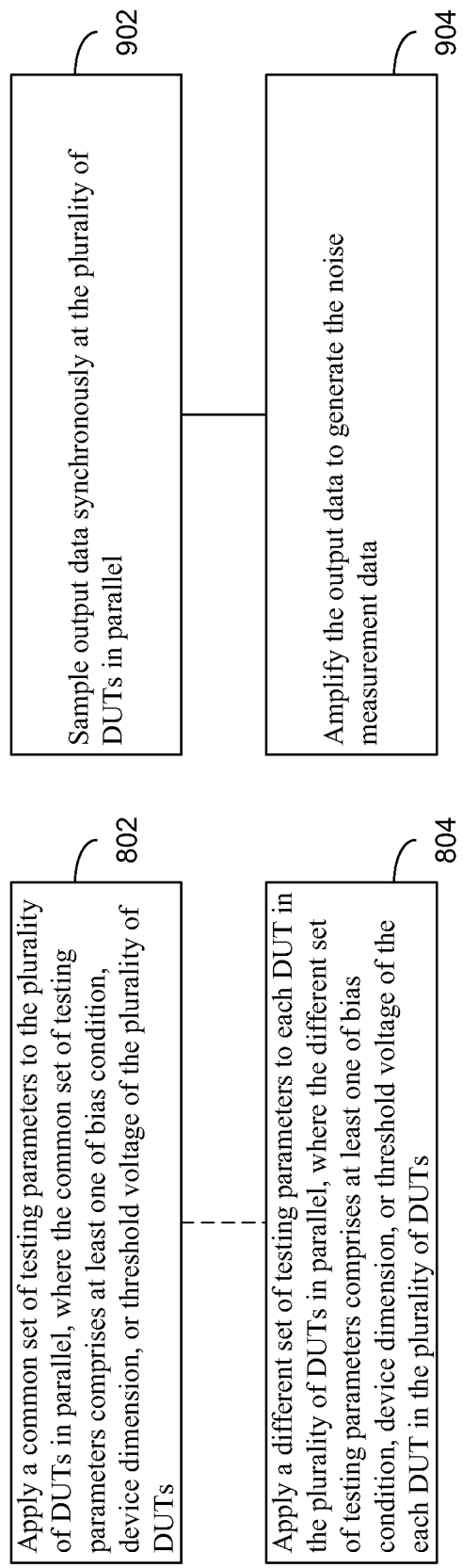
FIG. 8 illustrates exemplary implementations of performing noise measurement of a plurality of DUTs according to aspects of the present disclosure.
FIG. 9 illustrates an exemplary implementation of collecting noise measurement data from a plurality of DUTs according to aspects of the present disclosure.

FIG. 8 illustrates exemplary implementations of performing noise measurement of a plurality of DUTs according to aspects of the present disclosure. As shown in FIG. 8, in block 802, the method applies a common set of testing parameters to the plurality of DUTs in parallel, where the common set of testing parameters comprises at least one of bias condition, device dimension, or threshold voltage of the plurality of DUTs. In block 804, the method applies a different set of testing parameters to each DUT in the plurality of DUTs in parallel, where the different set of testing parameters comprises at least one of bias condition, device dimension, or threshold voltage of the each DUT in the plurality of DUTs.

FIG. 9 illustrates an exemplary implementation of collecting noise measurement data from a plurality of DUTs according to aspects of the present disclosure. In the exemplary implementation shown in FIG. 9, in block 902, the method samples output data synchronously from the plurality of DUTs in parallel. In block 904, the method amplifies the output data to generate the noise measurement data.

Figure 10:
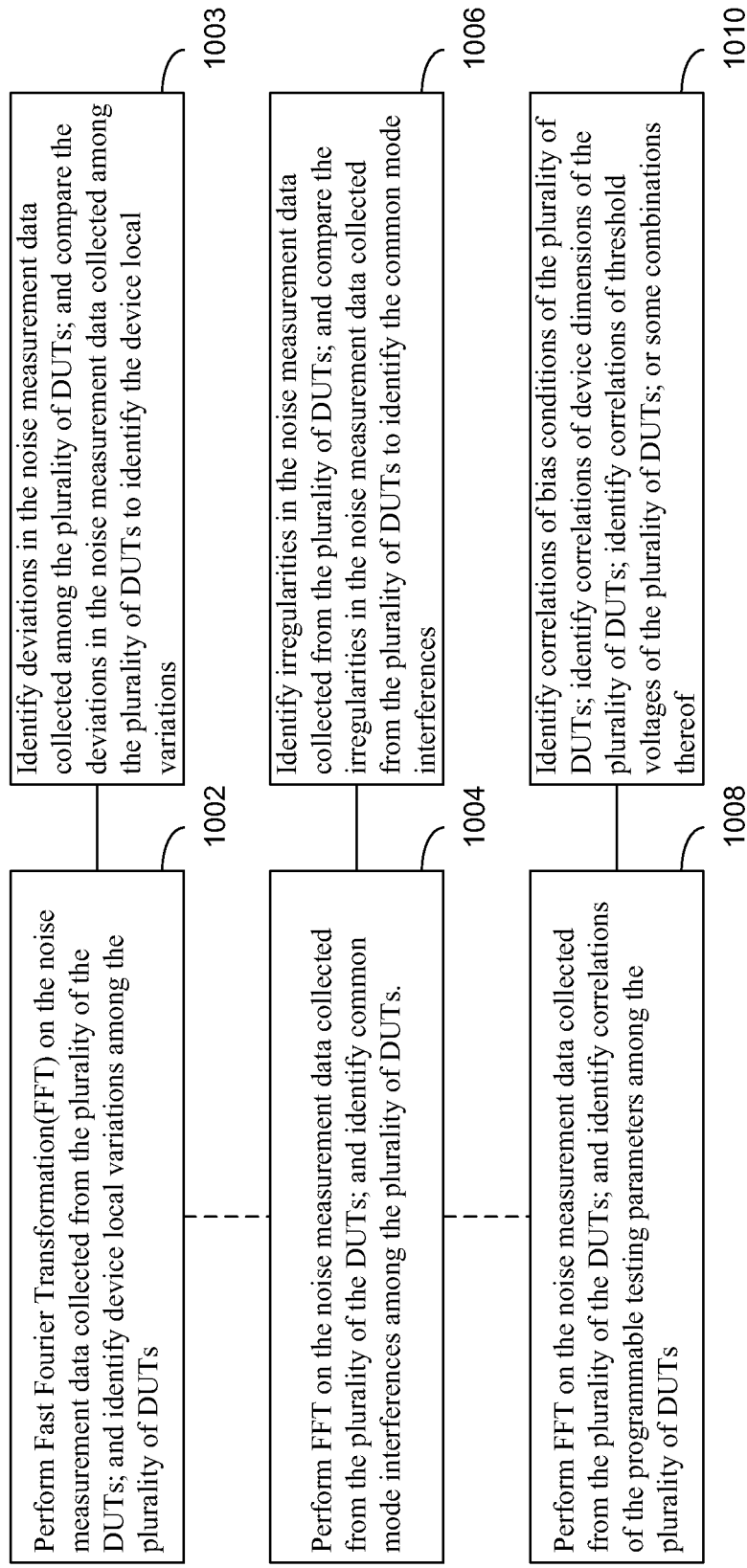
FIG. 10 illustrates exemplary implementations of analyzing noise measurement data according to aspects of the present disclosure.

FIG. 10 illustrates exemplary implementations of analyzing noise measurement data according to aspects of the present disclosure. As shown in the exemplary implementations of FIG. 10, in block 1002, the method performs Fast Fourier Transformation (FFT) on the noise measurement data collected from the plurality of the DUTs, where the noise measurement data is collected in a common duration of time during the noise measurement test; and the method identifies device local variations among the plurality of DUTs. According to aspects of the present disclosure, the method performed in block 1002 may also include the method performed in block 1003. In block 1003, the method identifies deviations in the noise measurement data collected among the plurality of DUTs; and the method compares the deviations in the noise measurement data collected among the plurality of DUTs to identify the device local variations.

In block 1004, the method performs FFT on the noise measurement data collected from the plurality of the DUTs, where the noise measurement data is collected in a common duration of time during the noise measurement test; and the method identifies common mode interferences among the plurality of DUTs. According to aspects of the present disclosure, the method performed in block 1004 may also include the method performed in block 1006. In block 1006, the method identifies irregularities in the noise measurement data collected from the plurality of DUTs; and the method compares the irregularities in the noise measurement data collected from the plurality of DUTs to identify the common mode interferences.

In block 1008, the method performs FFT on the noise measurement data collected from the plurality of the DUTs, where the noise measurement data is collected in a common duration of time during the noise measurement test; and the method identifies correlations of the programmable testing parameters among the plurality of DUTs. According to aspects of the present disclosure, the method performed in block 1008 may also include the method performed in block 1010. In block 1010, the method identifies correlations of bias conditions of the plurality of DUTs, identifies correlations of device dimensions of the plurality of DUTs, identifies correlations of threshold voltages of the plurality of DUTs, or some combinations thereof.

The methodologies described herein may be implemented by various means depending upon applications according to particular examples. For example, such methodologies may be implemented in hardware, firmware, or combinations thereof. In a hardware implementation, for example, a processing unit may be implemented within one or more application specific integrated circuits ("ASICs"), digital signal processors ("DSPs"), digital signal processing devices ("DSPDs"), programmable logic devices ("PLDs"), field programmable gate arrays ("FPGAs"), processors, controllers, micro-controllers, microprocessors, electronic devices, other devices units designed to perform the functions described herein, or combinations thereof.

Some portions of the detailed description included herein are presented in terms of algorithms or symbolic representations of operations on binary digital signals stored within a memory of a specific apparatus or special purpose computing device or platform. In the context of this particular specification, the term specific apparatus or the like includes a general purpose computer once it is programmed to perform particular operations pursuant to instructions from program software. Algorithmic descriptions or symbolic representations are examples of techniques used by those of ordinary skill in the signal processing or related arts to convey the substance of their work to others skilled in the art. An algorithm is here, and generally, is considered to be a self-consistent sequence of operations or similar signal processing leading to a desired result. In this context, operations or processing involve physical manipulation of physical quantities. Typically, although not necessarily, such quantities may take the form of electrical or magnetic signals capable of being stored, transferred, combined, compared or otherwise manipulated. It has proven convenient at times, principally for reasons of common usage, to refer to such signals as bits, data, values, elements, symbols, characters, terms, numbers, numerals, or the like. It should be understood, however, that all of these or similar terms are to be associated with appropriate physical quantities and are merely convenient labels. Unless specifically stated otherwise, as apparent from the discussion herein, it is appreciated that throughout this specification discussions utilizing terms such as "processing," "computing," "calculating," "determining" or the like refer to actions or processes of a specific apparatus, such as a special purpose computer, special purpose computing apparatus or a similar special purpose electronic computing device. In the context of this specification, therefore, a special purpose computer or a similar special purpose electronic computing device is capable of manipulating or transforming signals, typically represented as physical electronic or magnetic quantities within memories, registers, or other information storage devices, transmission devices, or display devices of the special purpose computer or similar special purpose electronic computing device.

The terms, "and," and "or" as used herein may include a variety of meanings that will depend at least in part upon the context in which it is used. Typically, "or" if used to associate a list, such as A, B or C, is intended to mean A, B, and C, here used in the inclusive sense, as well as A, B or C, here used in the exclusive sense. Reference throughout this specification to "one example" or "an example" means that a particular feature, structure, or characteristic described in connection with the example is included in at least one example of claimed subject matter. Thus, the appearances of the phrase "in one example" or "an example" in various places throughout this specification are not necessarily all referring to the same example. Furthermore, the particular features, structures, or characteristics may be combined in one or more examples. Examples described herein may include machines, devices, engines, or apparatuses that operate using digital signals. Such signals may comprise electronic signals, optical signals, electromagnetic signals, or any form of energy that provides information between locations.

While there has been illustrated and described what are presently considered to be example features, it will be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular examples disclosed, but that such claimed subject matter may also include all aspects falling within the scope of the appended claims, and equivalents thereof.

What is claimed is:

1. A method of performing noise measurement, comprising: setting up, by a controller, a plurality of device under tests (DUTs); performing, by a plurality of noise measurement channels controlled by the controller, noise measurement of the plurality of DUTs synchronously using programmable testing parameters to generate a noise measurement data; collecting, by the plurality of noise measurement channels controlled by the controller, the noise measurement data from the plurality of DUTs in parallel, comprising sampling output data synchronously from the plurality of DUTs in parallel, wherein the output data from the plurality of DUTs are sampled at the same time; and analyzing, by an analyzer controlled by the controller, the noise measurement data collected to identify deviations in noise performance caused by manufacturing process variations or environmental variations for the plurality of DUTs, wherein the analyzing is based on the output data from the plurality of DUTs that are sampled at the same time.

2. The method of claim 1, wherein performing noise measurement of the plurality of DUTs comprises:

applying a common set of testing parameters to the plurality of DUTs in parallel, wherein the common set of testing parameters comprises at least one of bias condition, device dimension, or threshold voltage of the plurality of DUTs.

3. The method of claim 1, wherein performing noise measurement of the plurality of DUTs further comprises:

applying a different set of testing parameters to each DUT in the plurality of DUTs in parallel, wherein the different set of testing parameters comprises at least one of bias condition, device dimension, or threshold voltage of the each DUT in the plurality of DUTs.

4. The method of claim 1, wherein collecting the noise measurement data from the plurality of DUTs further comprises:

amplifying the output data to generate the noise measurement data.

5. The method of claim 1, wherein analyzing the noise measurement data collected from the plurality of DUTs comprises:

performing Fast Fourier Transformation (FFT) on the noise measurement data collected from the plurality of the DUTs, wherein the noise measurement data is collected in a common duration of time during the noise measurement test; and identifying device local variations among the plurality of DUTs.

6. The method of claim 5, wherein identifying device local variations among the plurality of DUTs comprises:

identifying deviations in the noise measurement data collected among the plurality of DUTs; and comparing the deviations in the noise measurement data collected among the plurality of DUTs to identify the device local variations.

7. The method of claim 1, wherein analyzing the noise measurement data collected from the plurality of DUTs further comprises:

performing FFT on the noise measurement data collected from the plurality of the DUTs, wherein the noise measurement data is collected in a common duration of time during the noise measurement test; and identifying common mode interferences among the plurality of DUTs.

8. The method of claim 7, wherein identifying common mode interferences comprises:

identifying irregularities in the noise measurement data collected from the plurality of DUTs; and comparing the irregularities in the noise measurement data collected from the plurality of DUTs to identify the common mode interferences.

9. The method of claim 1, wherein analyzing the noise measurement data collected from the plurality of DUTs further comprises:

performing FFT on the noise measurement data collected from the plurality of the DUTs, wherein the noise measurement data is collected in a common duration of time during the noise measurement test; and identifying correlations of the programmable testing parameters among the plurality of DUTs.

10. The method of claim 9, wherein identifying correlations of programmable testing parameters comprise at least one of:

identifying correlations of bias conditions of the plurality of DUTs;

identifying correlations of device dimensions of the plurality of DUTs;

identifying correlations of threshold voltages of the plurality of DUTs;

or some combinations thereof.

11. A noise measurement system, comprising: a controller configured to set up a plurality of device under tests (DUTs); a plurality of noise measurement channels, controlled by the controller, configured to perform noise measurement of the plurality of DUTs synchronously using programmable testing parameters to generate a noise measurement data, and collect the noise measurement data from the plurality of DUTs in parallel comprising sample output data synchronously from the plurality of DUTs in parallel, wherein the output data from the plurality of DUTs are sampled at the same time; and an analyzer, controlled by the controller, configured to analyze the noise measurement data collected to identify deviations in noise performance caused by manufacturing process variations or environmental variations for the plurality of DUTs, based on the output data from the plurality of DUTs that are sampled at the same time.

12. The noise measurement system of claim 11, wherein the plurality of noise measurement channels and the controller are further configured to:

apply a common set of testing parameters to the plurality of DUTs in parallel, wherein the common set of testing parameters comprises at least one of bias condition, device dimension, or threshold voltage of the plurality of DUTs.

13. The noise measurement system of claim 11, wherein the plurality of noise measurement channels and the controller are further configured to:

apply a different set of testing parameters to each DUT in the plurality of DUTs in parallel, wherein the different set of testing parameters comprises at least one of bias condition, device dimension, or threshold voltage of the each DUT in the plurality of DUTs.

14. The noise measurement system of claim 11, wherein the plurality of noise measurement channels and the controller are further configured to:

amplify the output data to generate the noise measurement data.

15. The noise measurement system of claim 11, wherein the analyzer and the controller are further configured to:

perform Fast Fourier Transformation (FFT) on the noise measurement data collected from the plurality of the DUTs, wherein the noise measurement data is collected in a common duration of time during the noise measurement test; and identify device local variations among the plurality of DUTs.

16. The noise measurement system of claim 15, wherein the analyzer and the controller are further configured to:

identify deviations in the noise measurement data collected among the plurality of DUTs; and compare the deviations in the noise measurement data collected among the plurality of DUTs to identify the device local variations.

17. The noise measurement system of claim 11, wherein the analyzer and the controller are further configured to:
perform FFT on the noise measurement data collected from the plurality of the DUTs, wherein the noise measurement data is collected in a common duration of time during the noise measurement test; and
identify common mode interferences among the plurality of DUTs.

18. The noise measurement system of claim 17, wherein the analyzer and the controller are further configured to:
identify irregularities in the noise measurement data collected from the plurality of DUTs; and
compare the irregularities in the noise measurement data collected from the plurality of DUTs to identify the common mode interferences.

19. The noise measurement system of claim 11, wherein the analyzer and the controller are further configured to:
perform FFT on the noise measurement data collected from the plurality of the DUTs, wherein the noise measurement data is collected in a common duration of time during the noise measurement test; and
identify correlations of the programmable testing parameters among the plurality of DUTs.

20. The noise measurement system of claim 11, wherein the analyzer and the controller are further configured to perform at least one of:
identify correlations of bias conditions of the plurality of DUTs;
identify correlations of device dimensions of the plurality of DUTs;
identify correlations of threshold voltages of the plurality of DUTs;
or some combinations thereof.

21. The noise measurement system of claim 19, wherein each noise measurement channel in the plurality of noise measurement channels comprises:
a source measurement unit configured to control bias conditions of a DUT and provide power to the DUT for noise measurement; and
an amplifier unit configured to amplify noise output data received from the DUT;
wherein the source measurement unit and the amplifier unit are controlled by the controller.

* * * * *